United States Patent
Khan et al.

(10) Patent No.: US 8,476,125 B2
(45) Date of Patent: Jul. 2, 2013

(54) FABRICATION TECHNIQUE FOR HIGH FREQUENCY, HIGH POWER GROUP III NITRIDE ELECTRONIC DEVICES

(75) Inventors: M. Asif Khan, Irmo, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 749 days.

(21) Appl. No.: 12/515,997

(22) PCT Filed: Dec. 17, 2007

(86) PCT No.: PCT/US2007/087755
§ 371 (c)(1),
(2), (4) Date: Jan. 11, 2010

(87) PCT Pub. No.: WO2008/127469
PCT Pub. Date: Oct. 23, 2008

(65) Prior Publication Data
US 2010/0102359 A1    Apr. 29, 2010

Related U.S. Application Data

(60) Provisional application No. 60/875,031, filed on Dec. 15, 2006, provisional application No. 60/875,029, filed on Dec. 15, 2006.

(51) Int. Cl.
*H01L 21/338*      (2006.01)
(52) U.S. Cl.
USPC ........... 438/172; 257/192; 257/194; 257/213; 257/283; 257/330; 257/331; 257/E29.201; 257/E29.149; 257/E21.453; 438/167; 438/175; 438/182; 438/259; 438/270; 438/285; 438/571; 438/579; 438/590

(58) Field of Classification Search
USPC ......... 257/192, 194, 213, 283, 284, 330–334, 257/E29.201, E29.149, E21.453; 438/172, 438/167, 175, 182, 259, 270, 285, 571–579, 438/590
See application file for complete search history.

(56) References Cited

U.S. PATENT DOCUMENTS

| | | | |
|---|---|---|---|
| 5,192,987 A | 3/1993 | Khan et al. | |
| 5,705,443 A * | 1/1998 | Stauf et al. | 438/722 |
| 5,779,926 A * | 7/1998 | Ma et al. | 216/67 |
| 6,233,267 B1 | 5/2001 | Nurmikko et al. | |
| 6,277,219 B1 * | 8/2001 | Heinz et al. | 148/552 |

(Continued)

OTHER PUBLICATIONS

Fareed et al., "Vertically Faceted Lateral Overgrowth of GaN on SiC with Conducting Buffer Layers Using Pulsed Metalorganic Chemical Vapor Deposition", Applied Physics Letters, vol. 77, No. 15, Oct. 9, 2000, pp. 2343-2345.

(Continued)

*Primary Examiner* — Meiya Li
(74) *Attorney, Agent, or Firm* — Dority & Manning, P.A.

(57) ABSTRACT

Fabrication methods of a high frequency (sub-micron gate length) operation of AlInGaN/InGaN/GaN MOS-DHFET, and the HFET device resulting from the fabrication methods, are generally disclosed. The method of forming the HFET device generally includes a novel double-recess etching and a pulsed deposition of an ultra-thin, high-quality silicon dioxide layer as the active gate-insulator. The methods of the present invention can be utilized to form any suitable field effect transistor (FET), and are particular suited for forming high electron mobility transistors (HEMT).

16 Claims, 10 Drawing Sheets

U.S. PATENT DOCUMENTS

| | | | |
|---|---|---|---|
| 6,429,467 B1 | 8/2002 | Ando | |
| 6,521,961 B1 * | 2/2003 | Costa et al. | 257/402 |
| 6,573,129 B2 | 6/2003 | Hoke et al. | |
| 6,620,662 B2 | 9/2003 | Hoke et al. | |
| 6,797,994 B1 | 9/2004 | Hoke et al. | |
| 6,825,134 B2 * | 11/2004 | Law et al. | 438/788 |
| 8,338,273 B2 | 12/2012 | Khan et al. | |
| 8,372,697 B2 | 2/2013 | Khan et al. | |
| 2002/0031851 A1 | 3/2002 | Linthicum et al. | |
| 2003/0188682 A1 | 10/2003 | Tois et al. | |
| 2004/0119067 A1 | 6/2004 | Weeks, Jr. et al. | |
| 2004/0224484 A1 | 11/2004 | Fareed et al. | |
| 2005/0168127 A1 | 8/2005 | Shei et al. | |
| 2005/0183658 A1 * | 8/2005 | Nakahata et al. | 117/2 |
| 2007/0015344 A1 | 1/2007 | Mears et al. | |
| 2007/0063186 A1 | 3/2007 | Rao | |
| 2010/0140745 A1 | 6/2010 | Khan et al. | |

OTHER PUBLICATIONS

Zhang et al., "Pulsed Atomic Layer Epitaxy of Quaternary AlInGaN Layers", Applied Physics Letters, vol. 79, No. 7, Aug. 13, 2001.

Zhang et al., "Pulsed Atomic-Layer Epitaxy of Ultrahigh-Quality $Al_xGa_{1-x}N$ Structures for Deep Ultraviolet Emissions Below 230 nm", Applied Physics Letters, vol. 81, No. 23, Dec. 2, 2002, pp. 4392-4394.

Simin et al., "AlGaN/InGaN/GaN Double Heterostructure Field-Effect Transistor", Jpn. J. Appl. Phys., vol. 40, Nov. 1, 2001, pp. L1142-L1144.

* cited by examiner

FABRICATION TECHNIQUE FOR HIGH FREQUENCY, HIGH POWER GROUP III NITRIDE ELECTRONIC DEVICES

PRIORITY INFORMATION

The present application claims priority to U.S. Provisional Patent Application No. 60/875,031 filed on Dec. 15, 2006, naming Asif Khan and Vinod Adivarahan as inventors and U.S. Provisional Application No. 60/875,029 filed on Dec. 15, 2006, naming Asif Khan as the inventor, both of which are incorporated herein by reference.

GOVERNMENT SUPPORT CLAUSE

The present invention was developed with funding from the Defense Advanced Research Project Agency under contract no. DAAD19-02-1-0282. The government retains certain rights in the invention.

BACKGROUND OF THE INVENTION

AlGaN/GaN heterojunction field effect transistors (HFETs) are now well developed for delivering high output powers in the 2-8 GHz range. The focus of the research effort has now shifted to increasing their operating frequencies. The most efficient and direct way of increasing the operational frequencies is to reduce the gate length ($L_G$). However, reducing $L_G$ to values where the ratio of $L_G$ to the AlGaN barrier thickness is below 20-30, normally results in short-channel effects such as the threshold voltage shift and low breakdown voltages. This consequence results from the increased subthreshold drain-source leakage currents. Apart from the gate to channel separation, the short channel effects and the loss of gate modulation in small gate devices can also result from the poor confinement of the electrons in the two dimensional electron gas (2DEG) channel. For AlGaN/GaN HFETs, two practical approaches that have been reported to achieve better confinement are (1) the use of a double heterostructure (DH) design where the electrons are confined in a thin InGaN channel layer sandwiched between the AlGaN barrier and the GaN buffer layers of the heterojunction and (2) the use of a thin InGaN back barrier layer. It is now well established that gate leakage currents lead to a power degradation in GaN—AlGaN HFETs.

Thus, a need exists for a reduction in the gate leakage currents for many applications where group III nitride HFETs are used.

SUMMARY OF THE INVENTION

Objects and advantages of the invention will be set forth in part in the following description, or may be obvious from the description, or may be learned through practice of the invention.

In general, the present disclosure is directed toward methods of forming a HEMT device. According to the methods of the present invention, a substrate comprising a base layer, a buffer layer, a spacer layer, and a group III nitride epilayer is provided, and a source metal electrode and a drain metal electrode is positioned on the group III nitride epilayer. A first recess is etched in the group III nitride layer. Then, a second recess is etched in the group III nitride layer such that the second recess is positioned within the first recess. A dielectric layer is deposited in the second recess, and a gate electrode is positioned on the dielectric layer deposited in the second recess.

In another embodiment, the present invention is directed to HEMT devices formed from the disclosed methods. For example, the HEMT device can include a substrate comprising a base layer, a buffer layer, a spacer layer, and a group III nitride epilayer. A source metal electrode and a drain metal electrode can be positioned on the group III nitride epilayer. A first recess can be etched in the group III nitride layer. A second recess can then be etched in the group III nitride layer such that the second recess is positioned within the first recess. A dielectric layer is then positioned in the second recess, and a gate electrode is positioned on the dielectric layer deposited in the second recess.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

Figure 1:
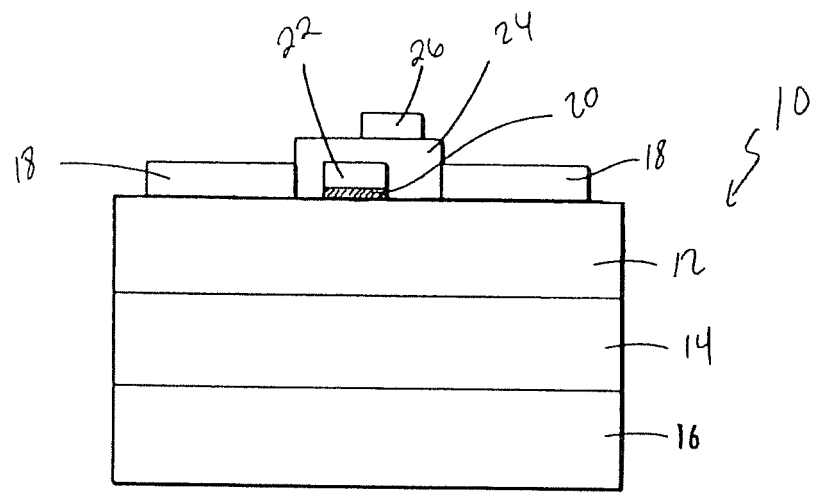
FIG. 1 shows a conventional HEMT device.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

In general, the present disclosure is directed to the fabrication methods of a high frequency (sub-micron gate length) operation of AlInGaN/InGaN/GaN MOS-DHFET, and the HFET device resulting from the fabrication methods. The method of forming the HFET device generally includes a novel double-recess etching and a pulsed deposition of an ultra-thin, high-quality silicon dioxide layer as the active gate-insulator.

The methods of the present invention can be utilized to form any suitable field effect transistor (FET), and are particular suited for forming high electron mobility transistors (HEMT). A HEMT is a field effect transistor with a junction between two materials with different band gaps (i.e. a heterojunction) as the channel instead of an n-doped region, thus HEMT structures are sometimes referred to as heterostructure field effect transistors (HFET).

The HEMT is a transistor which has a heterojunction formed between two semiconductor materials of different bandgaps. Current in such a device is confined to a very narrow channel at the junction, such current being known as a 2DEG (two dimensional electron gas). In one of the first developments of III-Nitride HEMT, U.S. Pat. No. 5,192,987 of Khan et al. discloses GaN/AlGaN based HEMTs grown on a buffer and a substrate. The general structure of these FET and HFET devices are known in the art. As such, the following description is directed to one embodiment of a HFET device; however, one of ordinary skill in the art would be able to use the following methods to form any suitable FET device.

For example, referring to FIG. 1, a conventional HEMT structure 10 is shown. In the shown embodiment, the HEMT structure 10 is shown having an upper layer (12), e.g., a group III nitride epilayer. The shown intermediate middle layer (14) is made of a single or a plurality of layers suitable for use in the HEMT structure 10. Any suitable layer(s) or epilayer(s) known for use in electronic devices (e.g., transistors, switches, power amplifies, etc.), optoelectronic devices (e.g., LEDs, laser diodes, etc.), surface acoustic devices, photodetector devices, and the like can be used as the intermediate middle layer (14).

The intermediate middle layer(s) (14) is positioned on a substrate (16). S-D metal electrodes (18) are positioned above the upper layer (12). Likewise, a gate dielectric (20) also overlies the upper layer (12). Overlying the gate dielectric (20) is the gate electronics (22). A silicon passivation layer (24) and the field plate electrode (26) are also shown positioned on the HFET structure 10, as known in the art.

In order to increase the operating frequency of such transistor devices, one needs to decrease the gate width. However there are geometrical limitations beyond which the gate width can not be decreased. This limitation stems from the fact that when gate width is reduced below 15 times (approximately) the channel thickness the carriers from the two dimensional electron gas (often called as 2DEG) starts to spill over to either the surface of the device or to the buffer thus causing sub-threshold leakage problems. This then manifests itself as premature breakdown problems and also causes inferior device performance such as output conductance etc. So, ideally after a certain limit, if the gate width is reduced one needs to reduce the channel thickness also.

According to the present invention, the distance between the gate dielectric (20) and the intermediate middle layer (14) is reduced. This reduction results in a reduced channel thickness. Thus, the gate width to channel thickness ratio can be increased (i.e., the gate width is relatively larger than the channel thickness). This increased ratio ensures that the carriers are not forced to spill over to either the surface or buffer, because of reduced potential across the 2DEG. This ensures higher output current, which will then yield higher output power at higher operating frequency which desired for many applications such as radar communication.

Figure 2:
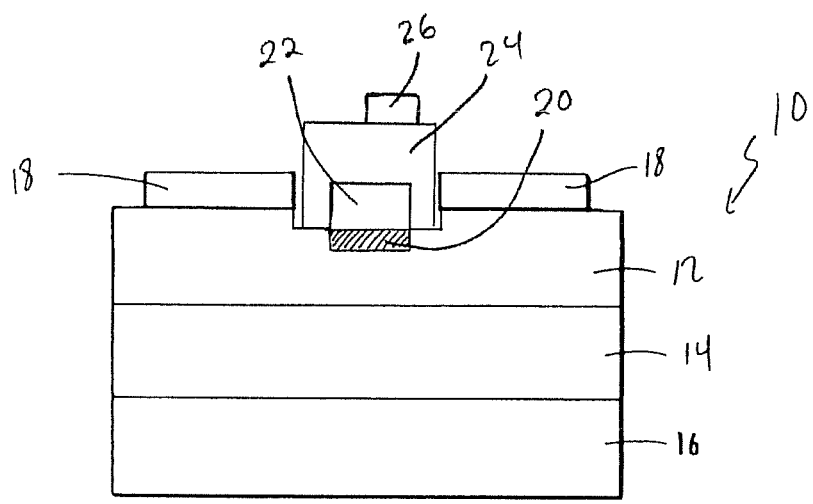
FIG. 2 shows an exemplary HEMT device according to one embodiment of the present invention.
Figure 3:
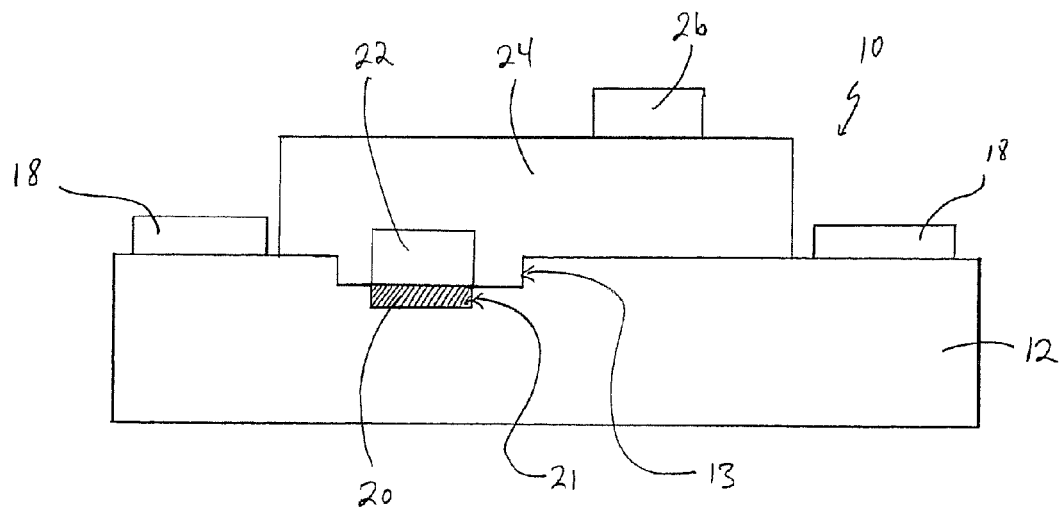
FIG. 3 is an exploded view of the HEMT device shown in FIG. 2.

Referring to FIG. 2, a HEMT structure 10 made according to the present invention is generally shown. As shown, the gate dielectric (20) is located within a lowest recess (21), which is in turn located within a first recess (13) located within the upper layer (12). FIG. 3 is an exploded view of the HEMT structure (10) shown in FIG. 2.

In order to form the first and lowest recess in the upper layer (12) of the HEMT structure 10, a novel double recess etching process was utilized. The double recess process enables the first and second recesses (13, 21) to be formed in the surface of the upper layer (12) without significantly sacrificing the quality of the upper layer (12).

I. Double Recess Etching Process

Figure 4:
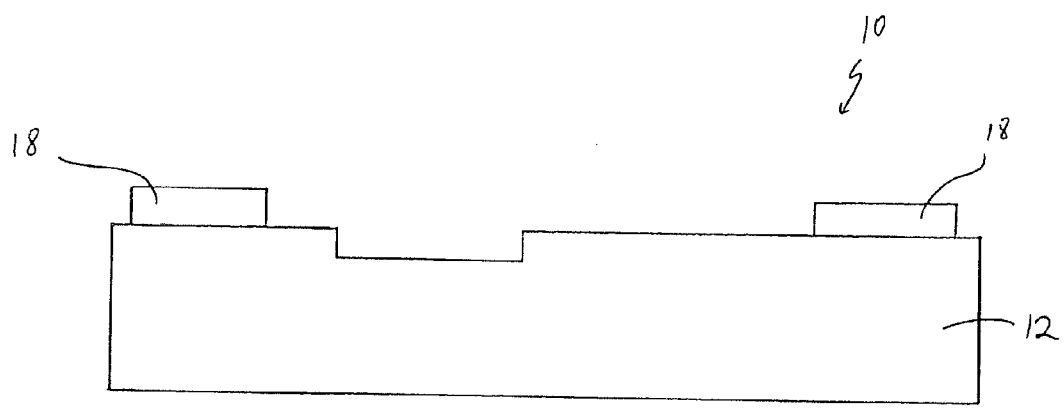
FIGS. 4-6 show exemplary intermediate HEMT devices produced during the process of forming the HEMT device according to the present invention.
Figure 5:
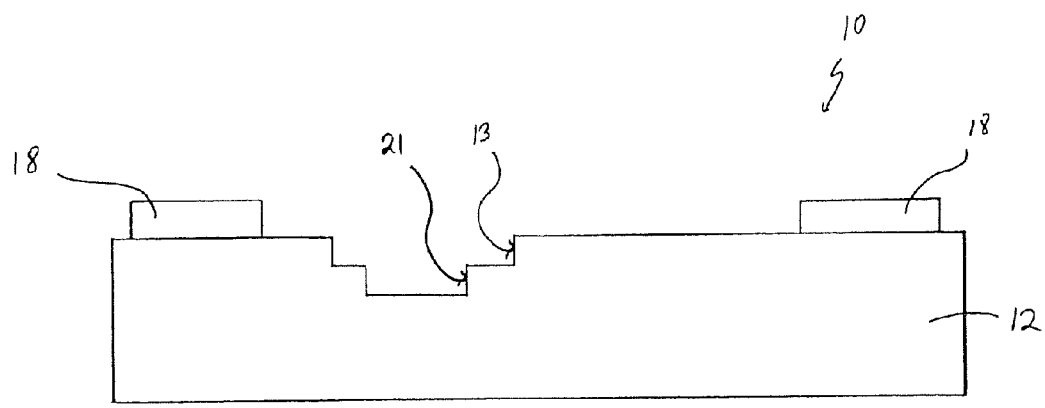
Figure 6:
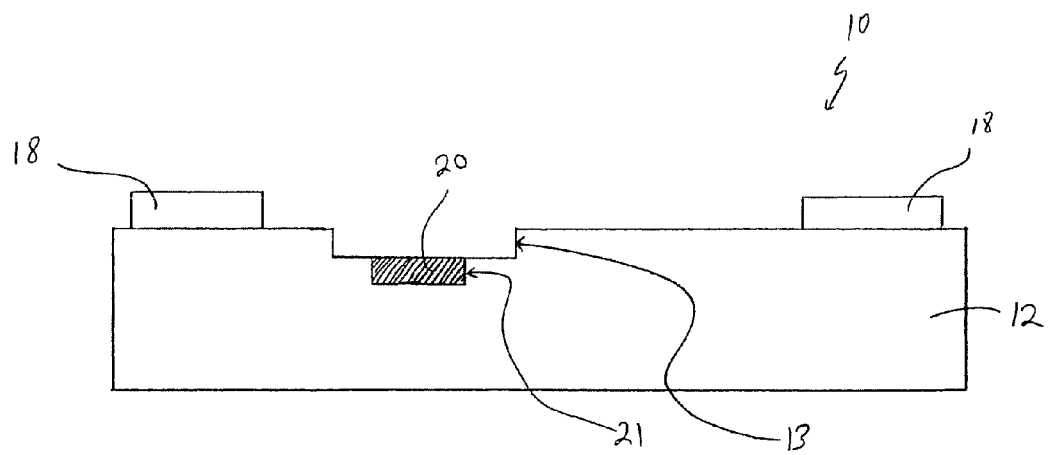

The double recess etching process involves a series of steps that result in several intermediate structures, such as those shown in FIGS. 4-6. In general, any transistor structure having a group III nitride upper layer can be utilized to form the transistors according to the disclosed methods. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

The group III nitride epilayer can be composed of any combination of group III elements (e.g., Al, In, and Ga) and nitride. In one particular embodiment, the group III-nitride epilayer can be represented by the formula $Al_xIn_yGa_{1-x-y}N$, wherein $0 \leq x \leq 1$, $0 \leq y \leq 1$ and $0 < x+y \leq 1$. In employing growth techniques to grow the group III nitride epilayer, the precursor sources typically include a metal-organic source (e.g., trimethyl aluminum, trimethyl gallium, triethyl gallium, trimethyl indium), a nitrogen source (e.g., ammonia), a carrier gas (e.g., hydrogen and/or nitrogen), and an optionally doping source (e.g., silane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

The group III nitride epilayer can be applied on a substrate using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Pulse atomic layer epitaxy (PALE) allows accurate control of the quaternary layer composition and thickness by simply changing the number of aluminum, indium, and gallium pulses in a unit cell and the number of unit cell repeats. By controlling the pulse time, pulse condition, flow rate, and therefore chemical availability, the systematic growth provides a layer with significantly control of the composition, thickness and crystalline quality.

Pulsed lateral overgrowth (PLOG) is a technique wherein a Group III comprising material (e.g., triethyl gallium or trialkly aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5, which is incorporated by reference herein. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

The first recess is formed in the upper group III nitride layer via lithograph techniques. For example, in one embodiment, a photoresist layer is applied to the upper group III nitride layer. The photo-resist coating can generally be composed of three basic elements: a base or resin, a solvent, and a polymer. As is well known in the art, exposing such photo-resist layers to ultra-violet radiation (e.g., wavelengths around 365 nm), the polymer properties can be substantially changed and/or altered.

In a general process of applying the photo-resist coating, the substrate is initially heated to a temperature sufficient to drive off any moisture that may be present on the surface. A liquid or gaseous "adhesion promoter", such as hexamethyldisilazane (HMDS), can then be applied to promote adhesion of the photo-resist coating to the substrate. The photo-resist coating can be applied by spin-coating on a spinner. As is known in the art, spin-coating involves dispensing a viscous, liquid solution of photoresist onto the substrate, followed by spinning the substrate to produce a substantially uniform photo-resist layer. The spin coating typically runs at 1200 to 4800 rpm for 30 to 60 seconds, and produces a layer between 2.5 and 0.5 micrometres thick. After application of the photoresist layer, the substrate can then be "soft-baked" or "prebaked" to drive off excess solvent, typically at 90 to 100° C. for 5 to 30 minutes. An oven or a hot-plate can be used.

Then, a mask may be placed over the photo-resist coating overlying the upper group III nitride layer of the substrate such that select portions of the photo-resist coating are exposed, while other portions of the photo-resist coating are shielded by the mask. These unshielded areas of the photoresist coating will ultimately correspond to the first recess area(s) in the group III nitride epilayer. After positioning the mask over the substrate, the mask and substrate combination is irradiated with an energy source (e.g., ultraviolet light). In its basic form, the "mask" serves to shield at least one area or section of the substrate from the irradiating energy source and to expose at least one adjacent section to the energy source. For example, the mask may be a generally transparent or translucent blank (e.g., a strip of material) having any pattern of shielded regions printed or otherwise defined thereon. The transparent/translucent, unshielded regions of the mask correspond to the exposed areas of the substrate member. Alternatively, the mask may simply be an object or objects placed over the substrate. Regardless of the particular type of mask utilized, it should be understood that any pattern can be utilized to form the desired selectively doped regions.

The energy source may be, for example, a light source, e.g., an ultraviolet (UV) light source, an electron beam, a radiation source, etc. In a "positive" photo-resist coating, the energy source irradiates the exposed areas of the photo-resist coating such that these portions can be removed from the substrate to expose the underlying upper group III nitride layer in those selected areas.

In this positive photo-resist coating, the energy source activates the exposed areas of the photo-resist coating so that these activated areas can be removed. More specifically, the energy source causes a chemical change that allows that portion of the photo-resist layer to be removed by a special solution, referred to as a "developer". In one embodiment, a metal-ion-free developer, such as tetramethylammonium hydroxide (TMAH), can be used to remove the activated portion of the photo-resist layer.

Alternatively, a "negative" photo-resist coating can be utilized in accordance with the present invention. In this negative photo-resist coating, the energy source irradiates the exposed areas of the photo-resist coating such that these portions become more robust, and less susceptible to removal from the substrate. Thus, the inactivated portions of the negative photo-resist coating can be removed to expose the underlying upper group III nitride layer in those selected areas.

Once the select areas of the photo-resist coating are removed, the underlying upper group III nitride layer is exposed in those select areas. For example, the center portion of the upper group III nitride layer is exposed, while the portions of the photo-resist coating that were shielded by the mask remain overlying the upper group III nitride layer.

Finally, the substrate having the upper group III nitride layer exposed in select areas and the photo-resist coating overlying the upper group III nitride layer in other areas, is subjected to an etching process to remove the remaining photo-resist coating and to create a first recess in the exposed upper group III nitride layer of the substrate. This etching results in the intermediate structure shown in the exploded view of FIG. 4, where a first recess (13) is formed in the upper group III nitride layer (12) of the HEMT structure (10). The etching process removes the photoresist layer remaining on the upper group III nitride layer while creating first recess (13) in the upper group III nitride layer (12).

Generally, etching can be performed by any method. Two common methods known in the art are (a) dry etching and (b) wet etching. In the dry etching technique, a reactive ion bombardment of chemical species are used to impinge on the surface with high energy. The chemical species can be, for example, fluorine ions from sources such as silicon hexafluoride, carbon tetrafluoride, etc. Due to the collision and chemical reactions, the exposed material is either etched away or sputtered away. The same can be achieved by employing even higher power density of ion species by involving inductively coupled plasma techniques whereby a very high radio-frequency (RF) power source is utilized in conjunction with a reactive ion coil. In the wet etching, a chemical is used to react chemically with the exposed areas to remove the undesired portions. Typically, the chemical is either an acid (hydrofluoric acid) or a base.

This first recess etching for III-N layer can be, in one particular embodiment, performed with chlorine gas chemistry, (e.g., $Cl_2$, $BCl_3$, $SiCl_4$ or any composition of chlorine gas chemistry). In some cases, Argon can be added to the mixture. The total gas composition can be a mix of the above mentioned gases. This etching is done at relatively low chamber pressure within the reactive ion chamber (or inductively coupled plasma chamber). Typically the pressure range is between 1 mTorr to 100 mTorr. The radio frequency (RF)

power that controls the etching rate is kept relatively lower than usual inductively coupled plasma (ICP) RF power for standard etching. In one embodiment, the RF power is kept within the range of 200 to 600 Watts.

After formation of the first recess (13), the first recess is exposed to fluorine isolation etching. This process helps to remove some of the impurities and jagged edges formed in the first recess to make a more uniform recess area, especially in the bottom of the first recess. The presence of fluorine atoms provides surface passivation effects which avoids the surface leakage through etching induced damages. However, it is critical to have the correct fluorine gas mixture and RF power so as not to damage the 2DEG irreversibly. In one embodiment, the RIE (RF) power is kept between 75 Watts to 300 Watts with the ICP RF power kept at zero watts. In yet another embodiment the gas mix consists essentially of sulphur hexafluoride, carbon tetra fluoride, argon, oxygen and helium. The time of etch depends on the amount of etch depth achieved by first III-N recess formed by chlorine etching and therefore in one particular embodiment the time can be 10 seconds to 360 seconds. After the etching process, the photoresist or PMMA/PMG (i.e., poly(methyl methacrylate)/poly(methyl glutarimide)) combination is removed or stripped off by boiling in organic solutions such as remover, acetone and/or iso-propanol.

Then, another recess is formed within the first recess. This second recess is formed according substantially the same process used to form the first recess. Specifically, a photoresist layer (PMMA/PMG combination can be used as e-beam lithography resist) is applied over the upper group III nitride layer and the first recess. Then, a portion of the photoresist layer located within the first recess is removed via lithography techniques. The second recess is etched in the exposed areas of the first recess. Thus, a second recess (21) is formed within the first recess (13), as shown in the exploded view of the intermediate HEMT structure (10) of FIG. 5.

In one embodiment, this second recess (21) is etched using a lower radio frequency (RF) power with chlorine gas, to minimize the damage to the base line of the second recess (21) and the underlying 2DEG or electron channel. The RF power ranges between 200-350 Watts and chamber pressure is kept between 1 mTorr to 30 mTorr.

This etching process can be repeated any number of times to form a deeper recess within the last recess. For simplicity reasons, the following discussion is directed to a HEMT device having a first recess and a second, lower recess. However, it is within the capabilities of one of ordinary skill in the art to apply the following method steps to the lowest recess, which is the second recess (21) in this embodiment.

In yet another embodiment, it is possible to use pulsed source of gases into the etching chamber to have different etch walls and profiles. Also, another embodiment of the invention involves cyclic etching between chlorine and fluorine chemistries in the same chamber.

II. Digital Dielectric Deposition

The gate dielectric can be formed within the lowest recess according to any process. In one particular embodiment, the gate dielectric is formed from silicon oxide or a silicon nitride through a Digital Dielectric Deposition (DDD) technique. In this process, a photoresist layer is applied to the upper group III nitride layer defining the first recess and the second recess. Then, using lithography techniques, the photoresist layer is removed from the second recess, while remaining on the rest of the upper group III nitride layer (including the first recess).

The DDD process that is utilized in the preferred embodiment can also be referred to as digital oxide deposition (DOD) and/or digital nitride deposition (DND). The DDD process is described in U.S. patent application Ser. No. 11/800,712 of Khan, et al., filed on May 7, 2007, which is incorporated by reference herein. This process allows for precise control of the thickness of the gate dielectric layer formed within the second recess. Typically, the preferred thickness is about 30 to about 50 angstroms units. However it will be well known to the ordinary skilled in the art that thicker dielectric layer can be used or deposited using DDD process when required to apply with larger gate widths and to reduce the gate forward leakage. Thus, the DDD layer thickness is driven by the application that the desired devices being fabricated.

Generally, the DDD process involves alternating the application of silicon and oxygen (and/or a nitrogen source) to the substrate in a PECVD growth chamber to form a silicon dioxide dielectric layer. Accordingly, the silicon source and the oxygen source are applied independently from each other. For example, the substrate is first exposed to the silicon source gas, without any oxygen source present. Following purging of the silicon source gas (e.g., through a vacuum and/or purge gas), the substrate is exposed to the oxygen source gas, without any silicon source present. However, the order of exposure to the source gases can be altered such that the substrate is first exposed to the oxygen source, without any silicon source present, followed by the silicon source without any oxygen source present. In typical embodiments, the RF power of the PECVD chamber during the deposition process is from about 5 W to about 300 W.

In each DOD cycle, a silicon source and an oxygen source are each individually and sequentially applied to the substrate. Together, these individual applications form a thin layer of silicon dioxide on the surface of the substrate. The amount of silicon and oxygen applied per cycle can be controlled in a variety of ways in a conventional PECVD chamber, including but not limited to, the composition of the source gas, the concentration of the source gas, the length of exposure for each pulse of source gas, the total flow of the source gas per pus as regulated by a mass flow controller, and the temperature of the source gas and/or substrate.

However, the silicon source gas and the oxygen or nitrogen source gas do not have to be applied sequentially and independently, but can be applied with overlapping pulses such that the oxygen or nitrogen source are pulsed while the silicon source is either continuously injected into the deposition chamber or is pulsed such that an overlap in time exists between the silicon and oxygen or nitrogen pulse. Thus, there may exist in each DOD or DND cycle some time by which the silicon source is injected into the deposition chamber when the oxygen or nitrogen source are not injected into the deposition chamber to facilitate the surface mobility of the silicon source gas that is referred to in the previous embodiment.

The resulting thickness of each cycle of alternating silicon source and oxygen source typically results in a deposition layer having a thickness of less than about 5 nanometers, such as from about 0.5 to about 3 nm, and in some embodiments, between about 1 to about 2 nanometers, such as from about 1 to about 1.5 nanometers. Thus, the thickness of the entire deposition layer can be controlled by the number of cycles performed. As a result, any desired thickness of the deposition layer can be achieved by regulating the number of cycles performed on the substrate. In some embodiments, the thickness of the resulting dielectric layer 20 can range from about 50 angstroms (Å) to about 250 Å, such as from about 100 Å to about 200 Å.

The source gases are applied to the substrate in a chamber at a controlled temperature. Controlling the temperature of the chamber can allow control of the amount and thickness of each deposited layer. Typically, the temperature range of the chamber ranges from about 65° C. to about 350° C., such as from about 150° C. to about 325° C. In certain embodiments, the temperature within the chamber can be from about 200° C. to about 300° C., and in some embodiment, from about 225° C. to about 275° C. In yet another embodiment, the temperature within the chamber can be from about 65° C. to about 190° C. The temperature on the surface of the substrate generally follows the temperature of the chamber.

The silicon for the dielectric layer can be provided from any suitable silicon source. Typically, in PECVD chambers, the silicon source is provided in gaseous state. Suitable silicon source gases include, without limitation, silane gas ($SiH_4$), disilane ($Si_2H_6$), diethlysilane (DES), tetraethyl-ortho-silicate (TEOS), chlorosilane compounds, or mixtures thereof. Chlorosilane compounds can include, for example, dichlorosilane ($Si_2Cl_2H_2$), hexachlorosilane ($Si_2Cl_6$), silicon tetrachloride ($SiCl_4$), chlorosilane ($SiClH_3$), trichlorosilane ($SiCl_3H$), or combinations thereof. In addition to the silicon source, the silicon source gas can include other, non-oxidizing additives. For example, a reducing agent can be included in the silicon source gas. Reducing agents can facilitate the deposition of silicon on the surface of the substrate. Common reducing agents include, but are not limited to, hydrogen ($H_2$) gas, nitrogen ($N_2$), and inert gases such as helium (He) and argon (Ar). Alternatively, the silicon source gas can be composed only of (or essentially only of) the silicon source.

Likewise, the oxygen for the dielectric layer can be provided from any suitable oxygen source. Typically, in chambers, the oxygen source is provided in gaseous state. Suitable oxygen source gases include, without limitation, oxygen gas ($O_2$), nitrous oxide ($N_2O$), ozone ($O_3$), water vapor ($H_2O$), or mixtures thereof. In some embodiments, the oxygen source gas can be composed only of (or essentially only of) the oxygen source. Alternatively, the oxygen source gas can also include reducing agents (e.g., $H_2$ and $N_2$) and/or inert gases (e.g., He and Ar).

Additionally, the amount of silicon and oxygen applied in each cycle can be controlled by the length of exposure of the source gases to the substrate. In each cycle, the silicon source gas and the oxygen source gas can be alternatively and independently exposed to the substrate for up to about a minute (i.e., 60 seconds). However, in most embodiments, a shorted period is all that will be required to produce a dielectric layer having a sufficient thickness. For example, the source gas can be exposed to the surface of the substrate for up to about 30 seconds, from about 0.1 seconds to about 10 seconds. In some particular embodiments, the pulse period for each source gas ranges from about 0.5 seconds to about 5 seconds, such as from about 1 second to about 3 seconds.

The respective pulses of the silicon source and the oxygen source can be controlled via a computerized system (i.e., digitally). As such, the amount of respective source gases applied to the substrate can be more precisely controlled, leading to greater control of the thickness of the resulting silicon dioxide layer(s).

No matter the amount or composition of the oxygen source gas applied to the substrate, the oxygen source is allowed to react with the silicon present on the surface of the substrate. Through this oxidation, the silicon deposited on the surface reacts with the oxygen source gas to form silicon dioxide. As stated, this layer of silicon dioxide formed from at least one cycle of alternating silicon and oxygen sources applied to the substrate, forms a dielectric layer on the substrate.

Although the above discussion references silicon dioxide, it should be understood that the reaction stoichiometry may be varied. As such, the dielectric layer may be formed from a silicon oxide material having the structure $Si_xO_y$, where x is an integer that is at least one (such as from 1 to 5) and y is a number from about 0.5 to about 6, such as from about 1 to about 5. Thus, the resulting dielectric layer may include other silicon oxide materials that vary in stoichiometry from $SiO_2$, but have similar properties.

In one embodiment, a nitrogen source can be substituted for or added to the oxygen source. Thus, the resulting dielectric layer can include silicon nitride molecules, such as $SiN_2$ or a stoichiometric variance thereof. For example, the silicon nitride can have the formula $Si_uN_v$, where $1 \leq u \leq 5$ and $2 \leq v \leq 8$. Thus, the dielectric layer can include either silicon oxide or silicon nitride molecules, or a combination of the two. For example, silicon oxynitride is also a suitable dielectric material (typically SiON, but can also include $Si_uO_yN_v$, where $1 \leq u \leq 5$, $1 \leq y \leq 10$, and $1 \leq v \leq 10$).

No matter the composition of the gate dielectric, the remaining photoresist layer can then be removed, along with any dielectric layer formed over the photoresist layer during the DDD process. Thus, a HEMT structure (10) having a gate dielectric (20) only in the second recess (21) can be formed, as shown in FIG. 6. It is imperative to not have DDD deposited silicon dioxide layer on all over the III-N surface as brings in additional series unnecessary capacitance that may result in lower operating frequency. Moreover it is well in the III-N field that presence of dielectric such as silicon dioxide increases the current collapse problems. However, in certain embodiment of the present invention the DDD deposited layer can be left over the entire surface of III-N layer provided the DDD dielectric layer is either silicon nitride or some composition of silicon oxynitride.

III. Soft Anneal

After formation of the gate dielectric (20) in the lowest recess (21), the structure is then subjected to a soft anneal process. As used herein, the "soft anneal process" refers to an annealing process involving a relatively low temperature applied to the substrate for a relatively extended period. For example, the soft annealing process can involve, in one embodiment, exposing the substrate to a temperature of from about 60° C. to about 420° C. for a period ranging from about 30 seconds to about 120 minutes. This soft anneal makes the dielectric-semiconductor interface more smooth and also helps in proper adhesion of the dielectric layer. The side-walls of the etched portions may have some residues of unwanted/unreacted gas particles that are left behind. This soft anneal will desorbs the particles, thus improving the leakage performance.

In one embodiment, the soft anneal can be performed after the fluorine etching itself and can be repeated after each etching steps.

IV. Gate Metal, Contacts, and Passivation

After completion of the gate dielectric layer, the gate metal and contacts can be positioned on the HEMT structure (10) according to known processes. Additionally, a silicon passivation layer can be applied to the HEMT structure (10) according to any process. In one particular embodiment, the silicon passivation layer is applied to the HEMT structure (10) according to the DDD process described above to form a silicon oxide and/or silicon oxynitride passivation layer.

V. Short Period Super-Lattice Structure for Barrier and Spacer Epilayers for Group III Nitride Electronic Devices Grown by Atomic Layer Epitaxy In one embodiment, the present invention is directed to a particular type of HEMT device that has a short period super-lattice structure. This particular device can have improved performance due to reduced trap and defect densities. In general, this particular structure has a group III nitride short period super-lattice with a spacer and channel layer to give rise to sharp and abrupt heterointerface, which is ideal quantum confinement with no spill over of electrons.

Figure 7:
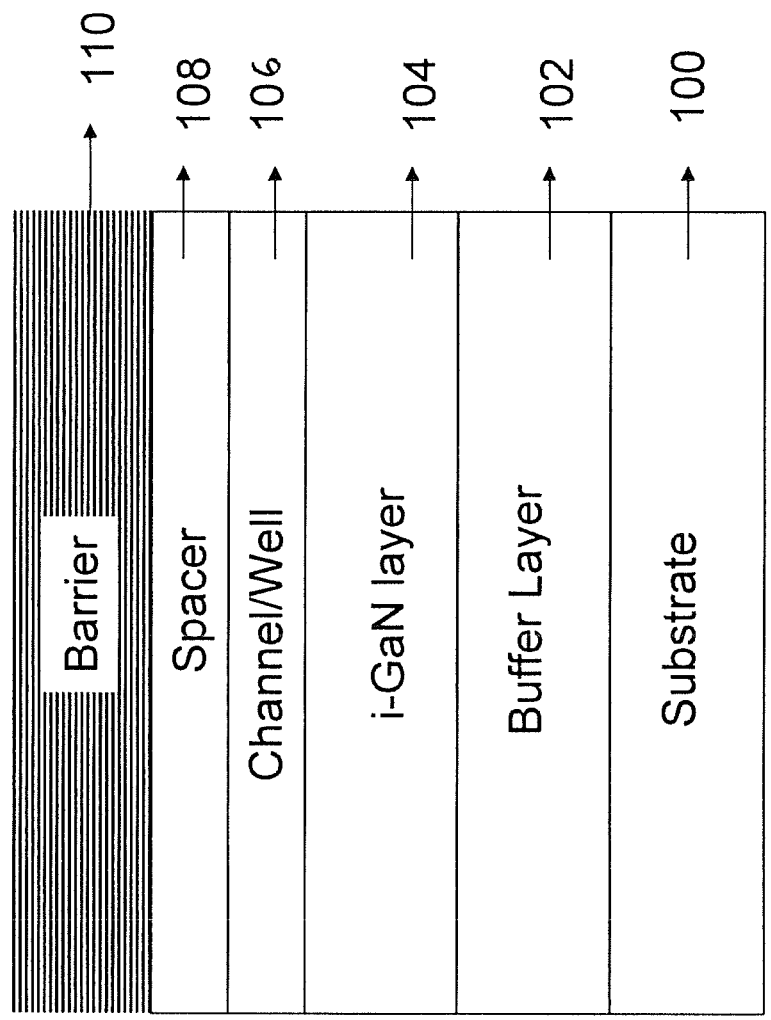
FIGS. 7 and 8 show particular substrates for use in the formation of the HEMT device of the present invention.

Referring to FIG. 7, a substrate (100) is shown having a buffer layer (102). The substrate can be, for example, a sapphire substrate, a silicon carbide, gallium nitride, aluminum nitride, aluminum gallium nitride or aluminum indium gallium nitride substrate, or any other suitable semiconductor substrate. The buffer layer (102) is shown as a single layer; however, other buffer layers may be included within the buffer layer (102), as is known in the art.

A group III nitride epilayer (104) is positioned on the buffer layer (102), and can be constructed from any combination of group III elements and nitrogen, as explained above. This layer can be formed, in one particular embodiment, through via PALE in order to selectively control the composition and thickness of the group III nitride epilayer (104).

In one embodiment, a channel/well layer (106) is then positioned on the group III nitride epilayer (104). This channel/well layer (106) can be a group III nitride layer that has a different chemical composition from the group III nitride epilayer (104), as is known in the art, and can have a thickness of from about 1 Å to about 50 Å. For example, the channel/well layer (106) can be an InGaN, AlGaN, or AlInGaN layer or super-lattice structure, where the stoichiometry of these compounds can vary as described above. A spacer layer (108) is then positioned above the channel/well layer (106). The spacer layer (108) can also be a group III nitride layer that has a different chemical composition from the channel/well layer (106) and can be formed via PALE in order to control the thickness and quality of the layer. For example, the spacer layer (108) can be an AlN or AlInGaN layer, where the stoichiometry of these compounds can vary as described above.

Finally, a barrier layer (110) is formed on the spacer layer (108). In the past, the thickness of the barrier layer (110) has been limited due to cracking on top of the barrier layer (110). This cracking generally occurred when the barrier layer reached a thickness of from about 200 Å to about 300 Å, depending on the amount of Al composition in the barrier layer (as the amount of Al increases, the thickness limit of the barrier layer decreases).

However, the present inventors have discovered that the use of pulsed atomic layer epitaxy (PALE) to form a short period super lattice barrier layer can result in a barrier layer having a significantly increased thickness. $Al_xIn_yGa_{1-x-y}N/Al_rIn_sGa_{(1-r-s)}N$ wherein $0 \leq x \leq 1$, $0 \leq y \leq 1$, $0 < x+y \leq 1$, $0 \leq r \leq 1$, $0 \leq s \leq 1$, $0 < r+s \leq 1$.

In growing the short period super lattice layer to form the barrier layer (110), PALE is utilized to grow individual layers of $Al_xIn_yGa_{1-x-y}N$ wherein $0 \leq x \leq 1$, $0 \leq y \leq 1$, $0 < x+y \leq 1$, and $Al_rIn_sGa_{(1-r-s)}N$ $0 \leq r \leq 1$, $0 \leq s \leq 1$, $0 < r+s \leq 1$ and the composition of $Al_xIn_yGa_{1-x-y}N$ and $Al_rIn_sGa_{(1-r-s)}N$ is different. In some cases, each individual layers have a thickness of up to about 100 Å (e.g., from about 1 Å to about 100 Å, and from about 1 Å to about 80 Å, from about 1 Å to about 60 Å, from about 1 Å to about 40 Å, from about 1 Å to about 20 Å, from about 1 Å to about 10 Å and from about 3 Å to about 4 Å). Each layer can be formed with a different chemical composition. For example, the barrier layer (110) can be made of AlN layers having intermittent GaN layers positioned within the barrier layer (110). Due to these GaN intermittent layers, the overall thickness of the barrier layer (110) can be grown to a total thickness of up to about 1000 Å, such as from about 100 Å to about 1000 Å. For example, in some embodiments, the barrier layer (110) can have a thickness of from about 50 Å to about 500 Å.

In another example, the Al composition 'x' of one individual layer $Al_xIn_yGa_{1-x-y}N$ varies between 5% to 60%, from about 10% to 40% and from about 20% to 35%. In another example, one individual layer $Al_xIn_yGa_{1-x-y}N$ of short period superlattice barrier is modulation doped and $Al_rIn_sGa_{(1-r-s)}N$ is modulation undoped. In another examples, a portion of the short period superlattice barrier (110) is doped and a portion of the short period superlattice barrier is undoped.

In one embodiment, the spacer layer (108) is formed using PALE and thickness of the spacer layer is from about 1 Å to about 30 Å, from about 1 Å to about 20 Å, from about 1 Å to about 10 Å, from about 1 Å to about 5 Å.

In another embodiment, the channel/well layer (106) can also be formed from a short period super-lattice, as described above. In growing the short period super lattice layer to form the channel layer (106), PALE is utilized to grow individual layers of $Al_xIn_yGa_{1-x-y}N$ wherein $0 \leq x \leq 1$, $0 \leq y \leq 1$, $0 < x+y \leq 1$, and $Al_rIn_sGa_{(1-r-s)}N$ $0 \leq r \leq 1$, $0 \leq s \leq 1$, $0 < r+s \leq 1$ and the composition of $Al_xIn_yGa_{1-x-y}N$ and $Al_rIn_sGa_{(1-r-s)}N$ is different. In some cases, each individual layers having a thickness of up to about 100 Å (e.g., from about 1 Å to about 100 Å, from about 1 Å to about 80 Å, from about 1 Å to about 60 Å, from about 1 Å to about 40 Å, from about 1 Å to about 20 Å, from about 1 Å to about 10 Å and from about 3 Å to about 4 Å).

Figure 8:
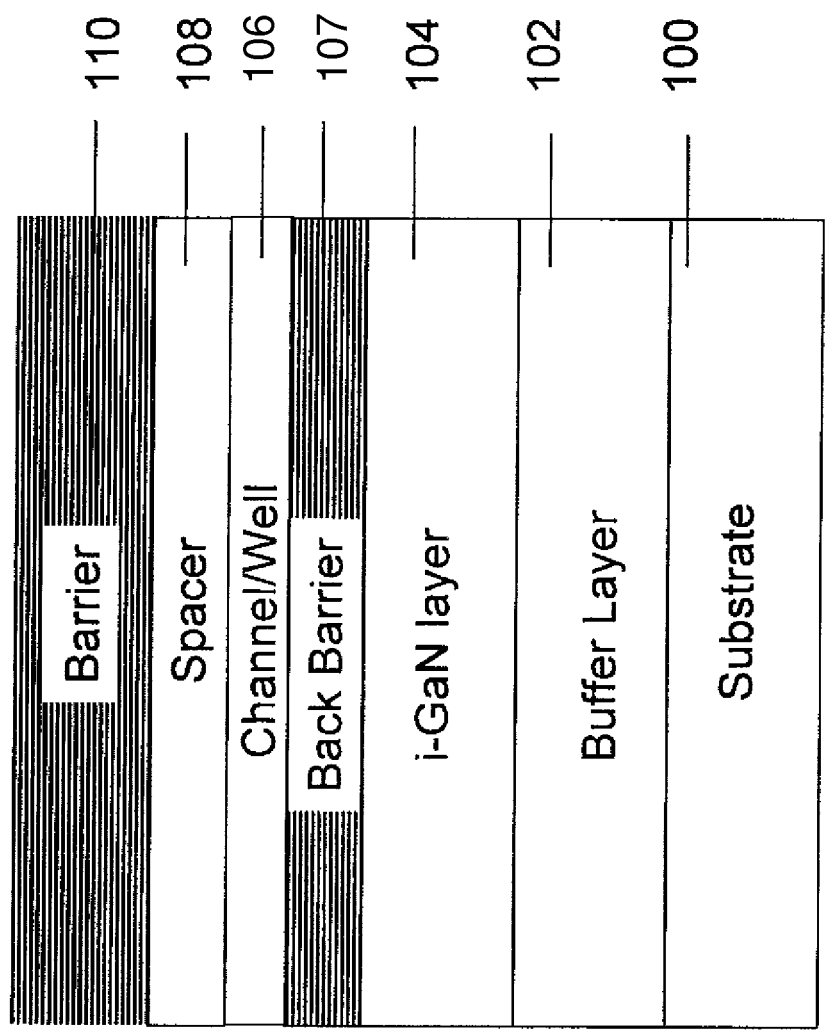

In another embodiment, such as shown in FIG. 8, an additional the back barrier layer (107) can also be formed from a short period super-lattice, as described above. In growing the short period super lattice layer to form the back barrier layer (107), PALE is utilized to grow individual layers of $Al_xIn_yGa_{1-x-y}N$ wherein $0 \leq x \leq 1$, $0 \leq y \leq 1$, $0 < x+y \leq 1$, and $Al_rIn_sGa_{(1-r-s)}N$ $0 \leq e \leq 1$, $0 \leq s \leq 1$, $0 < r+s \leq 1$ and the composition of $Al_xIn_yGa_{1-x-y}N$ and $Al_rIn_sGa_{(1-r-s)}N$ is different. In some cases, each individual layers having a thickness of up to about 100 Å (e.g., from about 1 Å to about 100 Å, from about 1 Å to about 80 Å, from about 1 Å to about 60 Å, from about 1 Å to about 40 Å, from about 1 Å to about 20 Å, from about 1 Å to about 10 Å and from about 3 Å to about 4 Å).

Example 1

An AlInGaN/GaN MOS-DHFET sample with an InGaN channel was grown by metalorganic chemical vapor deposition. The material growth procedure was similar to that described in G. Simin, Xuhong Hu, Ahmad Tarakji, Jianping Zhang, Alex Koudymov, Salih Saygi, Jinwei Yang, Asif Khan, Michael S Shur and Remis Gaska, "AlGaN/InGaN/GaN Double Heterostructure Field-Effect Transistor," Jpn. J. Appl. Phys., Vol 40 (2001), pp L1142-1144. The InGaN layer was grown at 820° C. to assist with the In incorporation. The In composition in the InGaN layer for this structure was calibrated using X-ray diffraction and photoluminescence analysis. A total charge density of around $1.5 \times 10^{13}$ cm$^{-2}$ and a mobility of 1240 cm$^2$/V-s were obtained by Hall measurements. The AlInGaN barrier had an aluminum alloy composition of 30% which was confirmed by photoluminescence and X-ray measurements. The thickness of the AlGaN barrier was around 200 Å (angstroms).

Figure 9A:
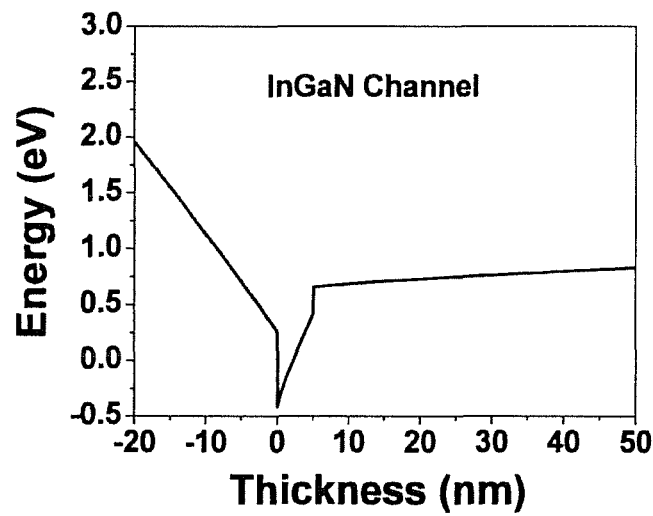
FIGS. 9a and 9b show simulated band diagrams of InGaN channel devices and those of InGaN back-barrier devices.
Figure 9B:
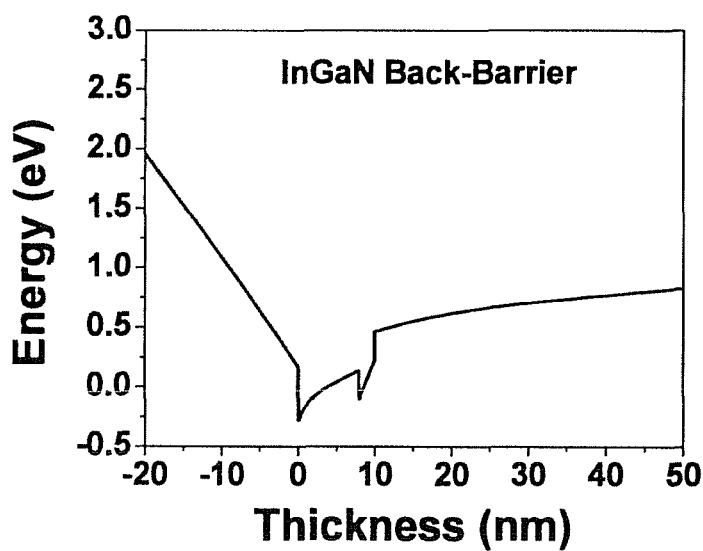

Then, the band diagrams of InGaN channel devices and those of InGaN back-barrier devices were simulated, as shown in FIG. 9 using the Synopsys Sentaurus Technology Computer-Aided Design (TCAD) simulator. As seen from the band diagrams, the InGaN channel devices have a deeper potential well than the InGaN back-barrier devices, while the potential well in the InGaN back-barrier devices is wider than that in the InGaN channel devices. Since the electrons in the InGaN channel devices are closer to the gate electrode, they should offer a better gate control. In addition, the notch created between the InGaN barrier and the GaN buffer in InGaN back-barrier devices is slightly away from the gate, thus, electrons inside the notch may not be depleted completely. Consequently, the drain leakage in InGaN channel devices is expected to be lower than that in the in GaN back-barrier devices especially in the sub-threshold region. The simulation in FIG. 9 was done without accounting for any outdiffusion of Indium atoms in the device structures. Such an outdiffusion due to the growth of subsequent layers can make the two band-diagrams nearly identical. This is currently being analyzed further and the results will be reported elsewhere.

Figure 10A:
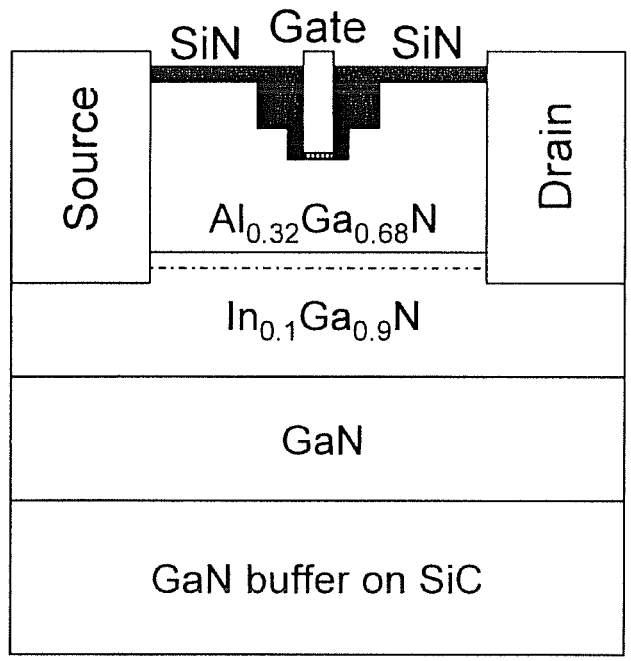
FIGS. 10a and 10b show an exemplary double-recess device structure according to the present invention.
Figure 10B:
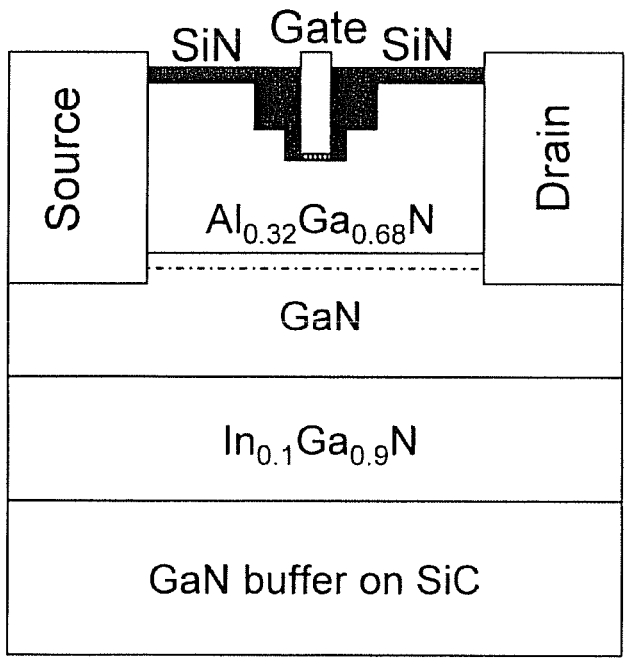

For device processing, first mesa isolation was done using $BCl_3/Cl_2$ plasma in an ICP system. This was followed by a Ti/Al/Ti/Au multilayer deposition for the ohmic contacts which were annealed at 800° C. for 1 min in forming gas. As mentioned earlier, in such sub-micron device the gate to channel separation is of critical importance. It becomes even more of an issue for the MOS-DHFET where a dielectric layer is inserted between gate electrode and the (2DEG) channel for suppressing the gate leakage current. In order to bring the gate electrode closer to the channel we have developed a novel double recess etching (DRE) process without sacrificing the high-quality of the AlGaN barrier surface. E-beam lithography was used to define the 0.35 μm wide trench for the first recess. The first recess employed a relatively faster etch to remove 40 Å (angstroms) of the top AlGaN barrier layer using a 75 V DC bias and a combination of $BCl_3$ and $Cl_2$ (chlorine) gases. This was followed by a second recess where the RF power was reduced by employing a 55 V DC bias. The trench for the second recess has a width and depth of 0.2 μm and 40 Å, which was aligned in the center of the first trench. After this double recess etching process, a high-quality and extremely uniform 30-40 Å layer of the gate-insulator (silicon-oxide) was deposited using a novel pulsed plasma enhanced chemical vapor deposition (PECVD) process at 300° C. An increased thickness of the gate-insulator leads to lower leakage currents but it also increases the output conductance (increased spacing between gate electrode and channel) thereby degrading the high-frequency operation. During the pulsed PECVD, a part of the wafer was covered and had no gate-insulator and thus provided standard DHFET devices for comparison. Finally, 0.18 μm wide (Ni/Au) gates were also fabricated by another e-beam alignment step. They were positioned within the second recess etch trench using new alignment marks defined by e-beam lithography. This was followed by probe contact deposition and silicon nitride passivation. The double-recess device structures are shown in FIG. 10.

Figure 11A:
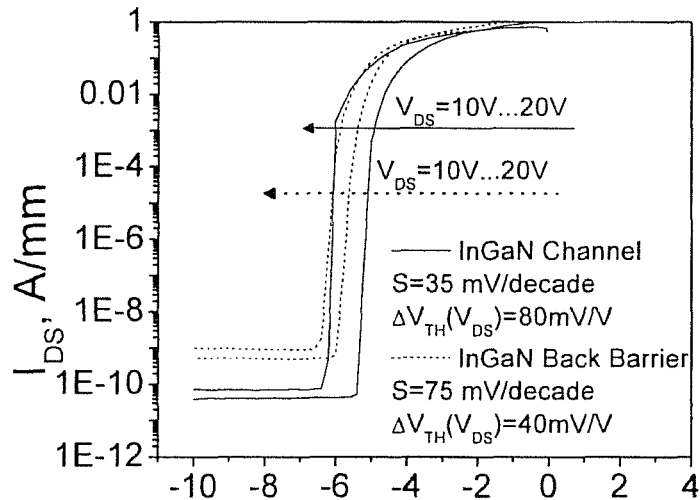
FIG. 11(a) shows plotted transfer characteristics and computed the subthreshold slope S according to Example 1.

The dc performance of the transistors was measured with an Agilent 4155B Semiconductor Parameter Analyzer. Peak currents as high as 1.3 Å/mm and peak transconductances of 320 mS/mm were measured. The figure of merit for a sub-micron MOSFET is the subthreshold slope S which is defined as mV of applied gate-voltage per decade of drain current change (mV/decade). The transfer characteristics were then plotted in FIG. 11(a) and computed the subthreshold slope S. As seen, the InGaN channel devices had very good pinch-off characteristics with a value of S=35 mV/decade. In order to compare the device epilayer design and its impact on sub-threshold slope S, MOS-DHFET and DHFET devices with similar geometries were fabricated using epilayers with an InGaN back-barrier design. For these structures the InGaN layer was sandwiched between the GaN buffer and the GaN channel layers. The GaN channel was deposited after the growth of InGaN epilayer. The growth temperature of the GaN channel was reduced from 1145° C., used to grow our conventional AlGaN/GaN HEMTs, to 920° C. These devices yielded a value of S=75 mV/decade which is relatively higher than InGaN channel devices. Compared with a reported sub-threshold slope of 77 mV/decade in InGaAs HEMTs and a slope of 78 mV/decade in InP HEMTs, the devices formed exhibit pretty decent subthreshold characteristics. In addition, in the sub-threshold region, the drain leakage in InGaN back-barrier devices was at least one order higher than that in the InGaN channel devices.

A second figure of merit for sub-micron gate devices is the change in threshold voltage with change in applied drain potential, denoted in units of mV/V. From the same FIG. 11(a), it can be inferred that for the InGaN back barrier devices this figure of merit (40 mV/V) is exactly half that of the InGaN channel devices (80 mV/V). However, due to the In out-diffusion for the two designs, in principle the growth conditions further reduce the difference between the two designs. Note in the InGaN-back barrier design the growth of the GaN channel at 920° C. can easily lead to this.

Figure 11B:
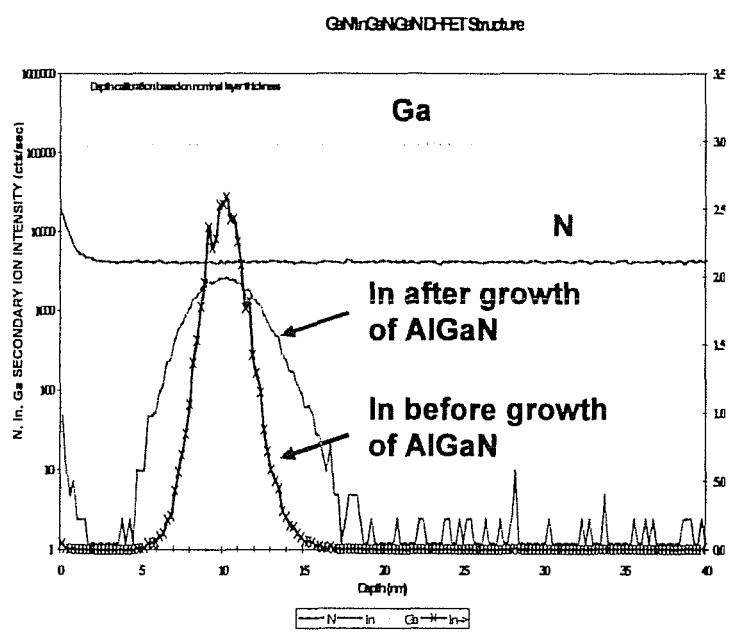
FIG. 11(b) shows the SIMS profile for the InGaN back barrier device structure.

The layer structures were then studied using secondary Ion Mass spectroscopy (SIMS). FIG. 11 (b) shows the SIMS profile for the InGaN back barrier device structure. It is clearly seen that due to the growth of the GaN channel layer, the effective width of InGaN back-barrier changes from 40 Å to about 80-100 Å. Thus in effect, depending on the various growth conditions the composition of the channel layer can be fairly complex due to varying In percentages. This data also elucidates that in either of the two designs viz., a) InGaN channel and b) InGaN back barrier the In out-diffusion can largely reduce the structure differences. It is also important to note that InGaN channel MOS-DHFET had a peak drain current of 1.0-1.1 Å/mm at zero gate bias, which is identical to the peak currents obtained for the InGaN back barrier devices, clearly indicating that the InGaN channel is not adversely affected by In clustering which can lead to a reduction in the carrier mobility.

Figure 12:
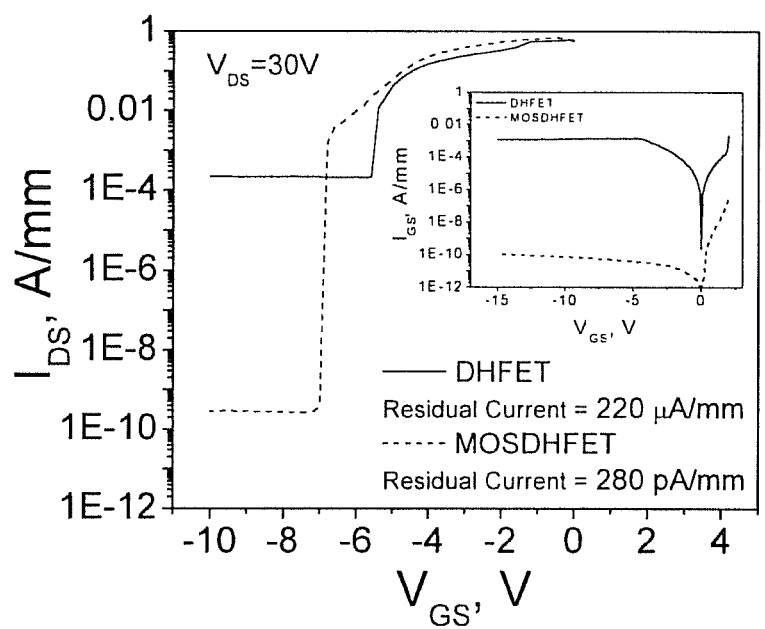
FIG. 12 compares the transfer characteristics of the Double Heterostructure Field Effect Transistor (DHFET) and the Metal-Oxide-Semiconductor Double Heterostructure Field Effect Transistor (MOS-DHFET) devices with InGaN channel design at a drain bias of 30 V.

In FIG. 12, the transfer characteristics of the DHFET and the MOS-DHFET devices with InGaN channel design at a drain bias of 30 V are compared. Additionally their gate-leakage currents are also shown in the inset to FIG. 12. It is evident that the vertical leakage under the gate-electrode is greatly reduced in the insulated gate devices. For the MOS-DHFET, the absolute leakage current at a drain bias of 30V was 280 pA/mm as compared to 220 pA/mm for an identical geometry DHFET. Even with an ultra-thin gate silicon dioxide (thickness about 40 Å), the gate leakage currents at +2 V gate bias from 2 pA for a DHFET could be suppressed to 2 nA for a MOS-DHFET. This indicates that of silicon dioxide obtained with our novel digital oxide deposition (DOD) technique is of very high structural quality. Also, only a very slight threshold voltage shift of around 1V between the DHFET and the MOS-DHFET was observed. Both devices could easily be operated till 60 V drain-bias without any breakdown. Thus, the InGaN channel devices can easily operate at drain biases of 28-48 V which is needed for several space and satellite communication applications.

Figure 13A:
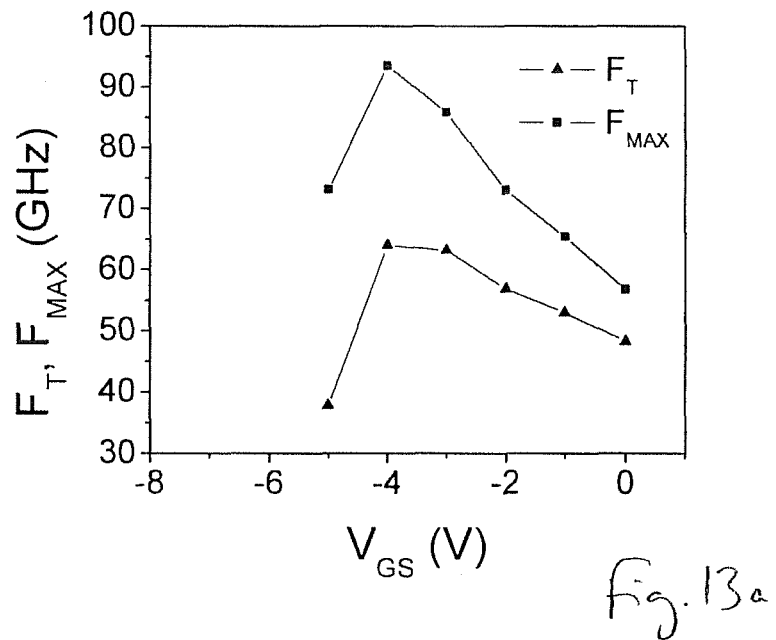
FIGS. 13a and 13b show the small signal analysis data for an InGaN channel device.
Figure 13B:
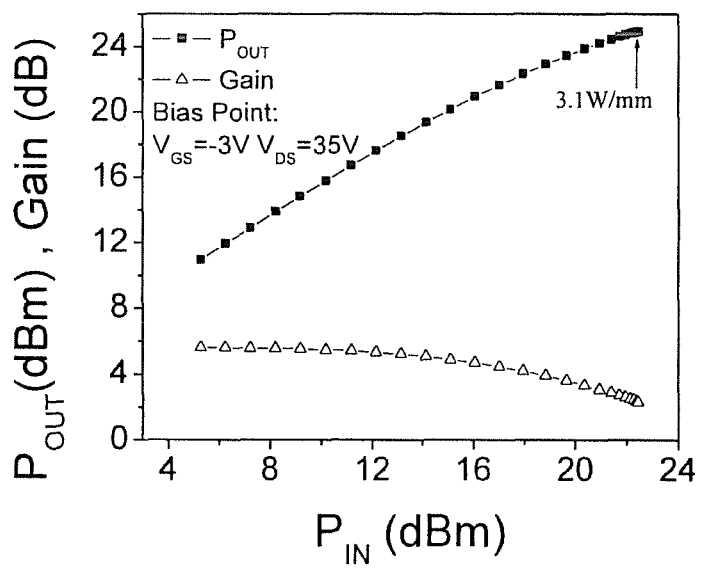

Small signal characterization with an Agilent PNAE8361A network analyzer was performed. A current-gain cut-off frequency $f_T$ as high as 50-65 GHz was measured for devices with $L_G$=180 nm. FIG. 13(a) shows the small signal analysis data for an InGaN channel device. As seen, the devices yielded an $f_{max}$ value of 94 GHz. Large signal RF power measurements were then carried out for passivated MOS-DHFET devices at 26 GHz. A total output power of 3.1 W/mm at a drain bias of 35 V was measured in FIG. 13(b). The power voltage ratio (PVR, i.e rf power/dc bias) of such a device is 0.1 W/V-mm. It is believed that these device parameters can further be improved by a) incorporating mushroom gates and floating field-plates and b) by decreasing the additional parasitic resistance which is due to the width of the first recess trench. It is important to note that any recessed-etch portion which is not covered with gate insulator and electrode are bound to cause adverse effect such as current dispersion (current collapse), parasitic impedances etc and hence currently we are developing a self-aligned gate lithography process for the MOS-DHFET which should eradicate some of the above mentioned problems.

Thus, it has been successfully demonstrated the feasibility of sub-micron low-threshold MOS-DHFET devices. The AlInGaN—InGaN—GaN double-heterostructure epilayer design coupled with a digitally deposited ultra-thin silicon dioxide gate-insulator in a double recess yielded devices with sub-threshold slope S as low as 35 mV/decade and $\Delta V_{th}/V_D$ of about 50 mV/V. For devices with a gate-length of 0.18 µm, an $f_T$ of 65 GHz and $f_{max}$ of 94 GHz were measured and the devices delivered an output powers of 3.1 W/mm at 35 V drain bias. Also, it has been shown that an effective suppression of the short-channel effect (decreasing the subthreshold slope S) and gate leakage currents in an AlGaN—InGaN—GaN MOS-DHFET.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of forming a high electron mobility transistor (HEMT) device, the method comprising:
    providing a HEMT structure comprising a substrate, a buffer layer over the substrate, a spacer layer over the buffer layer, and a group III nitride epilayer over the spacer layer;
    positioning a source metal electrode and a drain metal electrode on the group III nitride epilayer;
    etching a first recess in the group III nitride epilayer;
    after formation of the first recess in the group III nitride epilayer, fluorine isolation etching in the first recess;
    thereafter, etching a second recess in the group III nitride epilayer, wherein the second recess is positioned within the first recess;
    thereafter, depositing a dielectric layer in the second recess; and
    thereafter, positioning a gate electrode on the dielectric layer deposited in the second recess.

2. The method as in claim 1, wherein the dielectric layer is deposited via a digital dielectric deposition method comprising:
    pulsing a silicon source and an oxygen source to deposit the dielectric layer in the second recess.

3. The method as in claim 1, wherein the fluorine isolation etching is achieved with sulphur hexafluoride gas and carbon tertafluoride gas.

4. The method as in claim 1, wherein the second recess etching is followed by a soft anneal at anneal temperature range of 60° C. to about 420° C. for a time period ranging from about 30 seconds to about 120 minutes.

5. The method as in claim 1, further comprising:
    growing a silicon based passivation layer around the gate electrode, wherein the silicon based passivation layer is deposited via a digital dielectric deposition method; and
    positioning a field plate electrode on the silicon based passivation layer.

6. The method as in claim 1, wherein the buffer layer includes a plurality of layers.

7. The method as in claim 1, wherein the group III nitride epilayer comprises $Al_xIn_yGa_{1-x-y}N$, wherein $0 \leq x \leq 1$, $0 \leq y \leq 1$ and $0 < x+y \leq 1$.

8. The method as in claim 7, wherein the group III nitride epilayer comprises a short period super lattice, wherein the short period super lattice is grown via pulsed atomic layer epitaxy to form adjacent layers having a chemical structure of $Al_xIn_yGa_{1-x-y}N$ and $Al_rIn_sGa_{(1-r-s)}N$, respectfully, wherein $0 \leq x \leq 1$, $0 \leq y \leq 1$, $0 < x+y \leq 1$, $0 \leq r \leq 1$, $0 \leq s \leq 1$, $0 < r+s \leq 1$, and wherein x and r are different and y and s are different.

9. The method as in claim 1, wherein the spacer layer is deposited by pulsed atomic layer epitaxy and comprises $Al_xIn_yGa_{1-x-y}N$, wherein $0 \leq x \leq 1$, $0 \leq y \leq 1$ and $0 < x+y \leq 1$.

10. The method as in claim 1, wherein the dielectric layer comprises silicon oxide or silicon nitride.

11. The method as in claim 10, wherein the dielectric layer is deposited in the second recess and directly on the group III nitride epilayer.

12. The method as in claim 11, wherein the dielectric layer comprises a silicon oxide material having the structure $Si_xO_y$, where x is an integer that is from 1 to 5 and y is a number from about 0.5 to about 6.

13. The method as in claim 12, wherein y is from about 1 to about 5.

14. The method as in claim 12, wherein the dielectric layer comprises silicon dioxide.

15. The method as in claim 11, wherein the dielectric layer comprises a silicon nitride material having the formula $Si_uN_v$, where $1 \leq u \leq 5$ and $2 \leq v \leq 8$.

16. The method as in claim 15, wherein the dielectric layer comprises silicon nitride.

* * * * *